(12) United States Patent
Peczalski

(10) Patent No.: US 7,891,102 B2
(45) Date of Patent: Feb. 22, 2011

(54) NANOWIRE MAGNETIC COMPASS AND POSITION SENSOR

(75) Inventor: Andrzej Peczalski, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 425 days.

(21) Appl. No.: 12/184,772

(22) Filed: Aug. 1, 2008

(65) Prior Publication Data

US 2010/0024231 A1    Feb. 4, 2010

(51) Int. Cl.
*G01C 17/02* (2006.01)
(52) U.S. Cl. ........................ 33/355 R; 33/356
(58) Field of Classification Search ........... 33/355 R, 33/356–357, 351–352, 316; 702/92–94; 324/244, 260
See application file for complete search history.

(56) References Cited

U.S. PATENT DOCUMENTS

| | | | |
|---|---|---|---|
| 5,521,501 A | 5/1996 | Dettmann et al. | |
| 5,714,536 A | 2/1998 | Ziolo et al. | 524/430 |
| 5,889,091 A | 3/1999 | Ziolo et al. | 523/300 |
| 6,373,242 B1 | 4/2002 | Wappling | 324/207.21 |
| 2007/0297102 A1 | 12/2007 | Gill | 360/324.11 |
| 2010/0124091 A1* | 5/2010 | Cowburn | 365/80 |
| 2010/0223797 A1* | 9/2010 | Peczalski | 33/355 R |

FOREIGN PATENT DOCUMENTS

| | | |
|---|---|---|
| JP | 2002-310659 | 10/2002 |
| JP | 2004-205331 | 7/2004 |
| JP | 2006-010591 | 1/2006 |

OTHER PUBLICATIONS

International Search Report and Written Opinion from corresponding PCT Application Serial No. PCT/US2009/052359, mailed Mar. 9, 2010, 6 pages.

\* cited by examiner

*Primary Examiner*—G. Bradley Bennett
*Assistant Examiner*—Tania C Courson
(74) *Attorney, Agent, or Firm*—Fogg & Powers LLC

(57) ABSTRACT

A nanowire magnetic sensor and position sensor for determining the position of a magnetic object and direction of magnetic field is disclosed herein. The magnetic compass includes a number of magnetic nanosensor printed on a flexible substrate, which covers 360-degree angle at equal intervals. Each magnetic nanosensor generally includes magnetoresistive nanowires with high magnetic sensitivity printed in sets e.g. of ten on the flexible substrate. The flexible substrate can also be bent to form a circular configuration to detect the azimuth direction of the magnetic field. The individual nanosensors can be connected into resistive Wheatstone bridge configurations by metalization. The magnetic nanosensors can be utilized as a position sensor of a magnetic object for position determination. Additional electronics can also be mounted or printed on the flexible substrate from other type of nanowires.

25 Claims, 4 Drawing Sheets

NANOWIRE MAGNETIC COMPASS AND POSITION SENSOR

TECHNICAL FIELD

Embodiments are generally related to magnetic compasses. Embodiments are also related to position sensors. Embodiments are additionally related to methods for designing nanowire magnetic compass and position sensor for direction and position determination.

BACKGROUND OF THE INVENTION

Various types of equipment and systems for assisting in navigation and determining the location of a vehicle such as a boat, truck, automobile or airplane are known to the art. Such equipment and systems include various sensors for magnetic-effect sensing. Examples of common magnetic-effect sensors include Hall effect and magneto-resistive technologies. Such magnetic sensors can generally respond to a change in the magnetic field as influenced by the presence or absence of a ferromagnetic target object of a designed shape passing by the sensory field of the magnetic-effect sensor. The sensor can then provide an electrical output, which can be further modified as necessary by subsequent electronics to yield sensing and control information. The subsequent electronics may be located either onboard or outboard of the sensor package.

Various types of non-contact devices are presently available for measuring distance and detecting the linear and rotary position of an object. Magnetic compass is a navigational instrument for finding directions on the earth. Magnetic compass includes a magnetized pointer free to align itself accurately with earth's magnetic field, which is of great assistance in navigation. The face of the compass generally highlights the cardinal points of north, south, east and west. Magnetic position sensors utilized by the magnetic compass measure the direction and magnitude of magnetic fields by employing the magneto-resistive effect. Such sensors include two galvanic separated Wheatstone bridges for sensing the position of a magnetic object. Such magnetic position sensors are generally a non-contact type of sensors. As the magnetized pointer approaches the sensing device, the magnetic field of the pointer is detected and the sensing device generates an electrical signal that is then used for counting, display purposes, recording and/or control purposes.

Navigation requires magnetic compass with an angular resolution of 0.01 to 0.001 degree or better for precise position determination especially in a GPS (Global Positioning System) denied environment. Similarly, relative versus absolute azimuth resolution of the magnetic compass must also be high. Prior art magnetic position sensors provide a precision of about 0.1 degree and are expensive and possess limited accuracy of 5.5 millidegree (i.e., 16 bits).

Based on the foregoing it is believed that a need exists for an improved nanowire magnetic compass and position sensor for compassing and position determination as described in greater detail herein.

BRIEF SUMMARY

The following summary is provided to facilitate an understanding of some of the innovative features unique to the present invention and is not intended to be a full description. A full appreciation of the various aspects of the embodiments disclosed herein can be gained by taking the entire specification, claims, drawings, and abstract as a whole.

It is, therefore, one aspect of the present invention to provide for an improved sensor methods and systems.

It is another aspect of the present invention to provide for an improved nanowire magnetic compass and position sensor.

It is further aspect of the present invention to provide for an improved method for designing nanowire magnetic compass and position sensor for compassing and position determination.

The aforementioned aspects and other objectives and advantages can now be achieved as described herein. A nanowire magnetic compass and position sensor for determining the position of a magnetic object and direction of magnetic field is disclosed herein. The magnetic compass includes a number of magnetic nanosensor printed on a flexible substrate, which covers 360-degree angle at equal intervals. Each magnetic nanosensor generally includes magneto-resistive nanowires with high magnetic sensitivity printed in sets of ten on the flexible substrate. The individual nanosensors can be connected into resistive Wheatstone bridge configurations by metalization. The magnetic nanosensors can be utilized as a position sensor of a magnetic object for position determination.

The azimuth resolution and sensitivity of the sensor can be increased by bending the flexible substrate to form a circular configuration. Each of the groups of 10 nanowires will point at different azimuth direction that is determined by the number of the nanosensors e.g. for 100 groups of nanosensors they will cover the 360 degrees in 3.6 degree intervals. Knowledge of that interval helps to increase precision of the sensor. Additional electronics e.g. preamplifiers can also be printed or mounted on the flexible substrate from other types of nanowires.

Individual nanosensors can be connected into resistive bridge configuration using Anisotropic Magneto-Resistive (AMR) wires and/or Giant Magneto-resistive (GMR) wires. The magneto-resistive nanosensors can be connected utilizing different bridge configurations for AMR and GMR wires. By utilizing multiple nanosensors, the capability of extended angular or linear position measurements can be enhanced. The output of the resistive bridges can be aggregated in order to obtain high precision. The circular configuration can be formed with a diameter in the order of a millimeter. Such magneto-resistive nanosensors are extremely sensitive, low field, solid-state and able to measure direction and magnitude of earth's magnetic fields with high resolution.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope of such embodiments.

Figure 1:
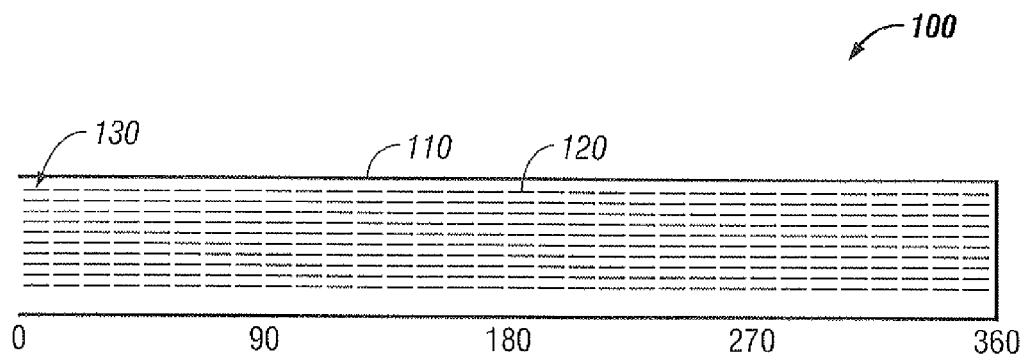
FIG. 1 illustrates a top view of a linear nanowire magnetic compass associated with magnetic nanosensors, in accordance with a preferred embodiment.

FIG. 1 illustrates a top view of a linear nanowire magnetic compass apparatus 100 associated with magnetic nanosensors covering 360-degree angle at equal intervals, in accordance with a preferred embodiment. The magnetic compass apparatus 100 generally includes a number of magneto resistive nanowires 120 printed on a flexible substrate 110 to create an array of miniature magnetic nanosensors 130. For example AMR occurs in certain ferrous materials such as permalloy and can be applied as a thin strip to become a resistive element. The magneto-resistive nanowires 120 can be printed and patterned on the flexible substrates 110 by photolithography or printing technique. Photolithography printing involves the deposition of a layer of photosensitive material on a semiconductor substrate, exposure of the photosensitive material through a mask, and development of the exposed photosensitive layer. Exposure is typically carried out in a scanner or stepper tool, wherein an exposure slit is passed across the surface of the substrate, thereby sequentially exposing narrow strips of the photosensitive layer. It can be appreciated that other types of printing techniques may also be utilized to print magneto resistive nanowires 120 on the flexible substrate 110, depending upon design considerations.

The linear array of magnetic nanosensor 130 includes magneto-resistive nanowires 120 in sets of ten in order to lower the variability of the nanosensor 130. The magneto-resistive nanowires 120 comprises of anisotropic magneto-resistive (AMR) nanowire or giant magneto-resistive (GMR) or other magnetoresistive nanowires, e.g. colossal magnetoresistive. The AMR effect changes a resistance of a magneto-resistive effect element in proportion to a square of a cosine of an angle formed between the magnetization of the element and the direction in which a sense current that flows through the element is conducted. The GMR effect, in particular, a spin-valve effect in which a resistance change of an element through which a sense current is flowing is generated due to a spin-dependence scattering that occurs at the interfaces of magnetic and nonmagnetic respective layers. The GMR effect does not depend on the angle between the current flow and magnetic field.

The magnetic compass apparatus 100 can be utilized as a position sensor for determining the position of a magnetic object with the precision determined by the length of each magnetic nanosensors 130 for e.g., 2-10 micron. The length and location of the magneto-resistive nanowires 120 can be precisely determined with photolithography printing process. The size of the linear array of magnetic nanosensors 130 and the small dimension of the magneto-resistive nanowires 120 enables very high resolution of about 1-0.1 millidegree. It should be appreciated that FIGS. 1-7 are only exemplary and are not intended to assert or imply any limitation with regard to the environments in which aspects or embodiments of the present invention may be implemented. However, it will be apparent to those of skill in the art that the more number of nanosensors can be utilized without departing from the spirit and scope of the present invention.

Figure 2:
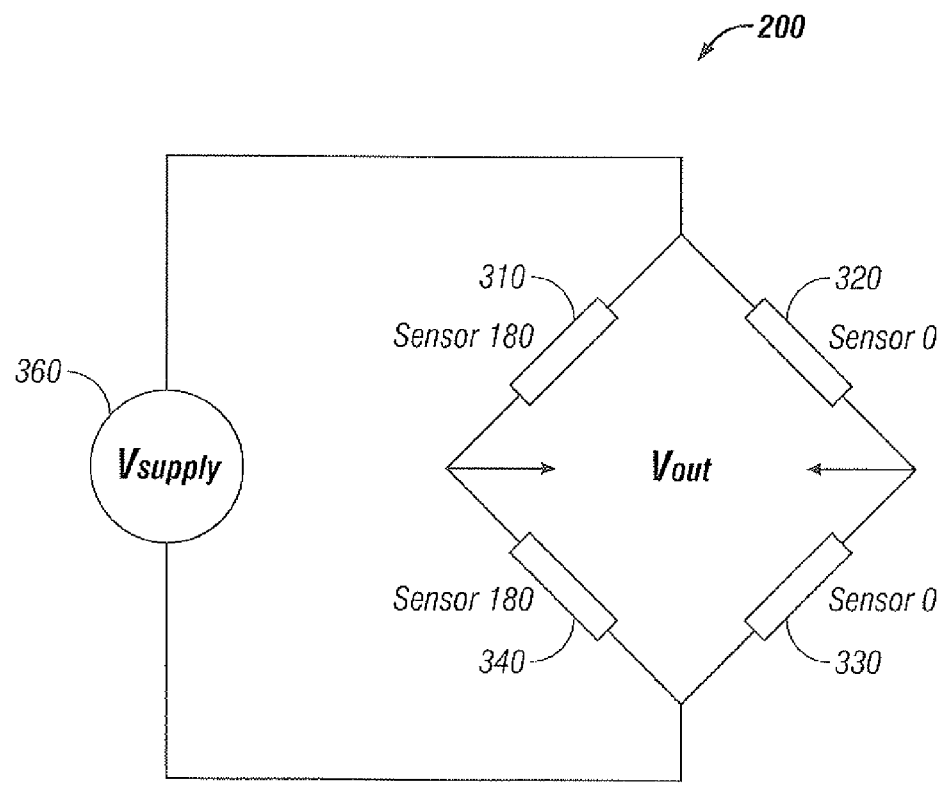
FIG. 2 illustrates a schematic diagram of a Wheatstone bridge circuit utilizing anisotropic magneto-resistive (AMR) nanowire sensors, in accordance with a preferred embodiment.

FIG. 2 illustrates a schematic diagram of a Wheatstone bridge circuit 200 utilizing AMR nanowires sensors 130, in accordance with a preferred embodiment. Note that in FIGS. 1-8, identical or similar parts are generally indicated by identical reference numerals. The nanosensors such as sensor 310, 320, 330 and 340 associated with the magnetic compass apparatus 100 includes AMR nanowires 120 as four resistive elements of the Wheatstone bridge circuit 200. Each magneto-resistive nanosensors 310, 320, 330 and 340 possesses an ability to change resistance in a $(\cos(a))^2$ relationship where 'a' refers to the magnetic field angle with respect to the current flow direction in the magnetic element. The top and bottom connections of the four nanosensors 310, 320, 330 and 340 can be given a direct current (DC) stimulus in the form of a supply voltage 340, with the remaining side connections to be measured. The side contacts can be at the same voltage, except for a small offset voltage due to manufacturing tolerances on the AMR elements when no magnetic field is supplied. The side contacts will produce a differential voltage as a function of the supply voltage 340, MR (magnetoresistance) ratio, and the magnetic field angle 'a'. The high precision of the linear nanowire magnetic compass 100 can be obtained by aggregating outputs of many bridges such as the Wheatstone bridge circuit 200.

The optimal arrangement of the individual nanowires in the Wheatstone bridge is different for AMR with cos ^2 angle between nanowire axis (current direction) and magnetic field dependence and GMR with $(1-\cos(a))/2$ dependence where a is an angle between the nanowire axis and magnetic field. For example the AMR configuration may involve the sensor 320, 330, 340, and 310 of FIG. 2 to be at 0, 90, 180, 270 degree position respectively. It should be noted that this configuration is identical with the diamond-like configuration typical in case of just four magnetic sensors. Whereas the GMR sensors 320, 330, 340, and 310 may be connected in the positions corresponding to 0, 180, 90, 270 degrees.

Figure 3:
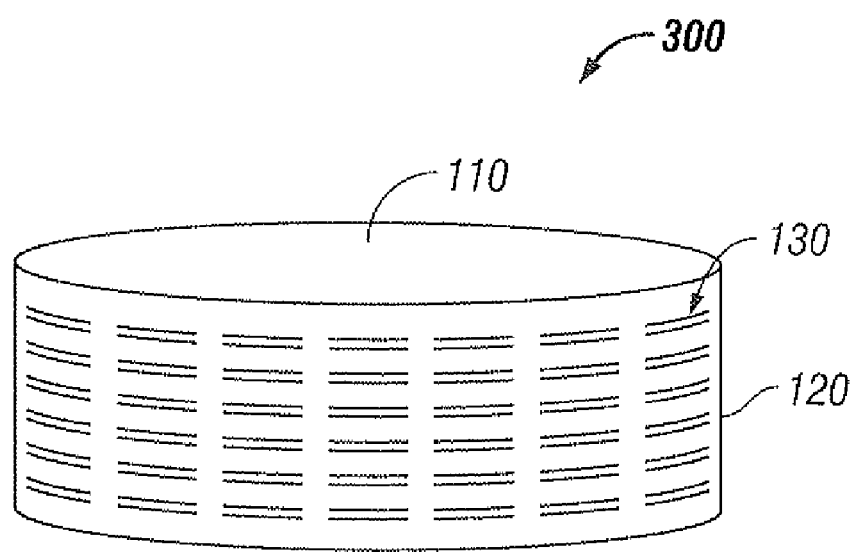
FIG. 3 illustrates a perspective view of the nanowire magnetic compass in a circular configuration, in accordance with a preferred embodiment.
Figure 4:
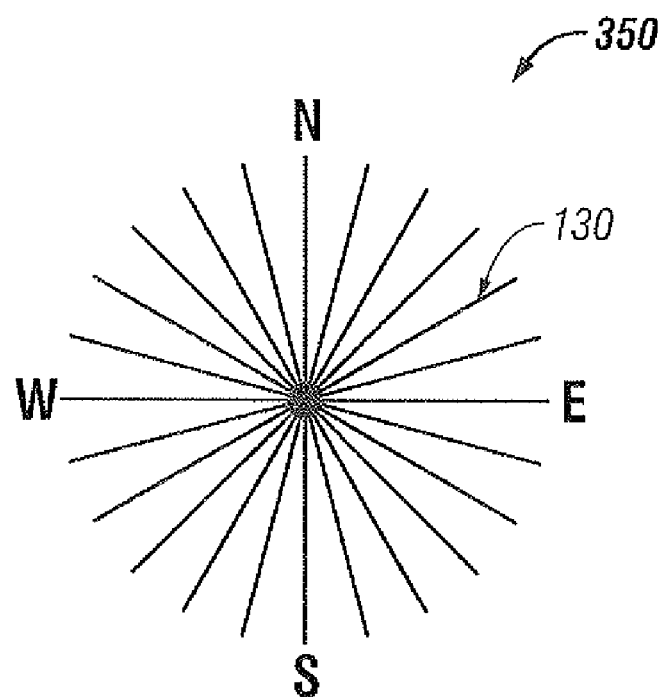
FIG. 4 illustrates the equivalent magnetic field direction for the nanowire configuration of FIG. 3, which can be implemented in accordance with a preferred embodiment.
Figure 5:
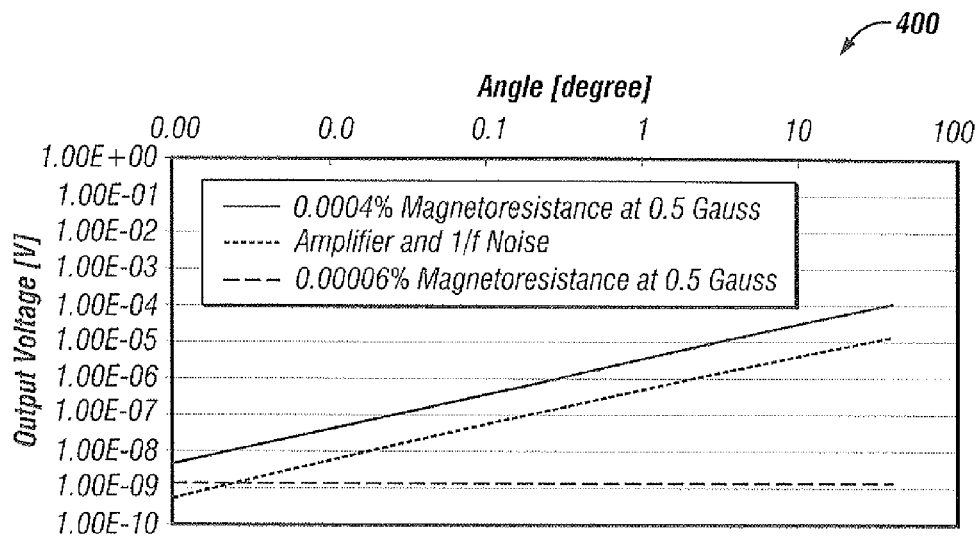
FIG. 5 illustrates a graphical representation illustrating the performance of a AMR nanowire magnetic compass, in accordance with a preferred embodiment.

FIG. 3 illustrates a perspective view of the nanowire magnetic compass in a circular configuration 300, in accordance with a preferred embodiment. The flexible substrate 110 can be bent to form a circular configuration 300. The magnetic nanosensors 130 on the circular configuration 300 will detect the azimuth direction of magnetic field with the resolution exceeding 0.001 degree. FIG. 4 illustrates a perspective view of the magnetic nanosensors in correspondence with the magnetic field direction 300, which can be implemented in accordance with a preferred embodiment. The magnetic nanosensors 130 in the circular configuration 300 corresponds to the magnetic field direction as indicated as N, S, E and W generally highlights the cardinal points of north, south, east and west or positions of 0, 90, 180 and 270 degrees in notation use above.

FIG. 4 illustrates a graphical representation 400 illustrating the performance of the AMR nanowire magnetic compass apparatus 100, in accordance with a preferred embodiment.

The AMR magneto-resistive nanowires 120 form good magnetic nanosensors 130. The graphical representation 400 depicts the magnetoresistance change with respect to the magnetic field angle 'a', as $(\cos(a))^2$ with amplitude 0.0004% and 0.00006% with Co nanowires. As in indicated in the table shown in FIG. 5, the AMR magneto-resistive nanowires 120 discussed with respect to FIG. 4, the generates 1% magnetoresistance change, which may exceed sensitivity of 1 millidegree. Similarly, the power dissipation of 360 nanosensors comprises of 90 resistive bridges each consisting of 10 magneto-resistive nanowires, 80 nm diameter, 10 micron long can be only 30 mW at 1 V bias.

Figure 6:
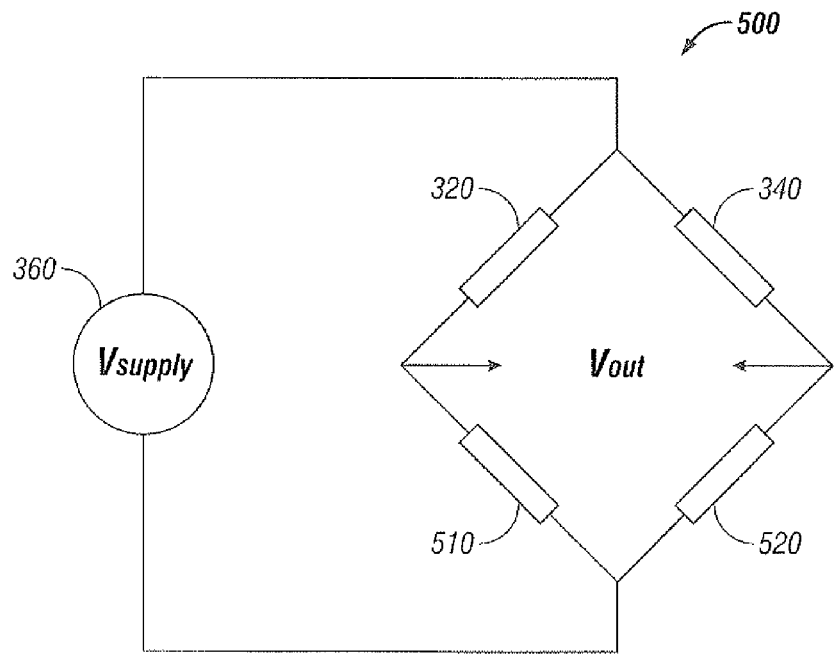
FIG. 6 illustrates a schematic diagram of a Wheatstone bridge circuit utilizing giant magneto-resistive (GMR) nanowire sensors, in accordance with an alternative embodiment.

FIG. 6 illustrates a schematic diagram of a Wheatstone bridge circuit 500 utilizing GMR nanowire sensor, in accordance with an alternative preferred embodiment. The nanosensors such as sensor 510, 320, 520 and 340 associated with the magnetic compass apparatus 100 includes GMR nanowires 120 as four resistive elements of the Wheatstone bridge circuit 500. The magneto-resistive nanosensors 510, 320, 520 and 340 can be configured as a four-element Wheatstone bridge to convert magnetic fields to differential output voltages. The four nanosensors 510, 320, 520 and 340 can be oriented as described in paragraph 0027 with the ends connected together by metalization to form the Wheatstone bridge circuit 500. The Wheatstone bridge circuit 500 generally includes passive components that do not emit any fields or broadband noise.

Figure 7:
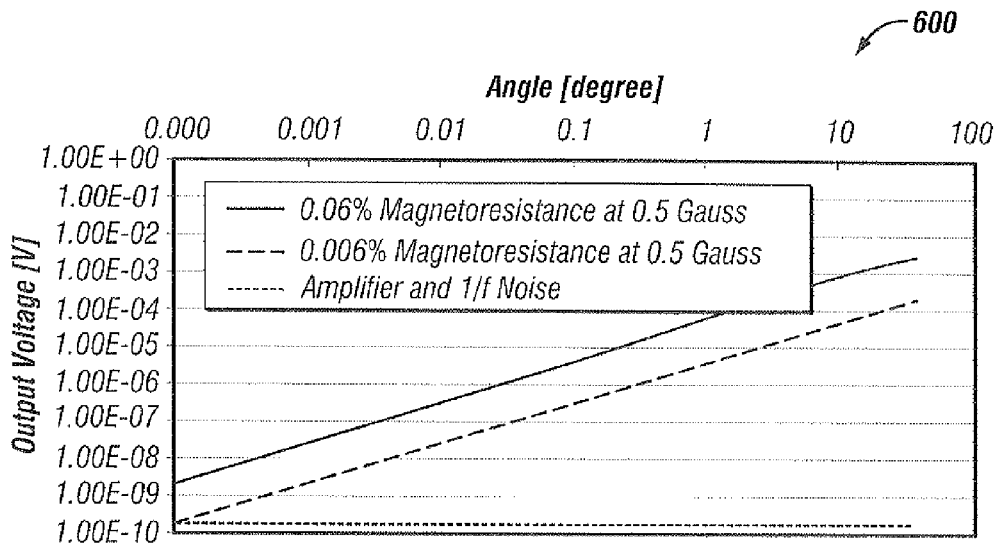
FIG. 7 illustrates a graphical representation illustrating the performance of a GMR nanowire magnetic compass, in accordance with an alternative embodiment.

FIG. 7 illustrates a graphical representation 600 illustrating performance of GMR nanowire magnetic compass apparatus 100, in accordance with an alternative embodiment. The graphical representation 500 depicts the magnetoresistance change with respect to the magnetic field angle a, as $(1-\cos(a))/2$ with amplitude 0.06%, or 0.006% and with permalloy/Cu, 85 nm diameter nanowires. As depicted in the table in FIG. 7, the AMR magneto-resistive nanowires 120 referred to in FIG. 4 generates 20% magnetoresistance change, which may exceed sensitivity of 1 millidegree. The power dissipation of 360 nanosensors sensors comprises of 90 resistive bridges each consisting of 10 nanowires, 80 nm diameter, 10 micron long can be only 30 mW at 1 V bias.

Figure 8:
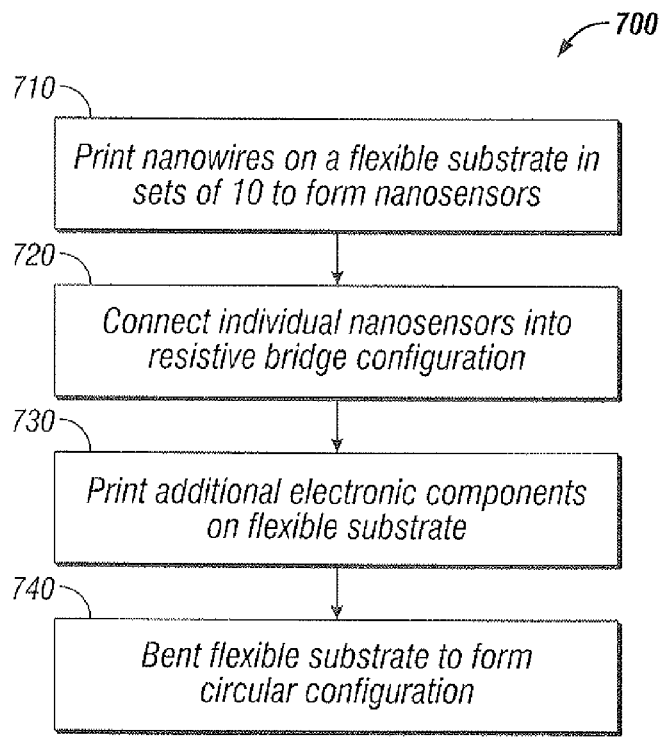
FIG. 8 illustrates a detailed flow chart of operations illustrating logical operational steps of a method for designing a nanowire magnetic compass and position sensor, in accordance with a preferred embodiment.

FIG. 8 demonstrates a detailed flow chart of operations illustrating logical operational steps of a method 700 for designing a nanowire magnetic compass 100 and position sensor, in accordance with a preferred embodiment. The magneto-resistive nanowires 120 can be printed or otherwise patterned on a flexible substrate 110 in sets of ten to form nanosensors 130, as shown at block 710. Thereafter, as illustrated at block 720, the individual nanosensors 130 can be connected into a resistive bridge configuration such as the Wheatstone bridge circuit 200 and 500. The linear array of nanosensors 130 can be utilized as a position sensor for determining the position of a magnetic object and the precision can be determined by the length of each nanosensor 130. The additional electronic components can also be printed mounted on the same flexible substrate 110 utilizing other type of nanowires, as shown at block 730. The flexible substrate 110 can be bent to form a circular configuration 300, as depicted at block 740. The nanosensors 130 on the circular configuration 300 determines the azimuth direction of magnetic field with the resolution exceeding 0.001 degree.

The magneto-resistive nanosensors 130 can be designed to accurately detect the direction and magnitude of external magnetic fields for compassing and magnetometry applications. Such magneto-resistive nanosensors 130 are extremely sensitive, low field, solid-state magnetic sensors designed to measure direction and magnitude of earth's magnetic fields. Similarly, the size of the array of nanosensors 130 and the small dimension of the nanowires 120 enables very high resolution forming potentially low cost sensor for compassing and position determination.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for designing nanowire magnetic sensor, comprising:
    depositing a plurality of magneto-resistive nanowires on a flexible substrate to create an array of magnetic nanosensors wherein said array of magnetic nanosensor comprises at multiple nanowires in order to lower variability of said array of magnetic nanosensors; and
    bending said flexible substrate into a circular configuration wherein said array of magnetic nanosensors associated with said circular configuration detect an azimuth direction of magnetic field with high resolution thereto.

2. The method for designing nanowire magnetic sensor in claim 1, further comprising the step of connecting said array of magnetic nanosensors in at least one Wheatstone bridge configuration by metalization thereby sensing a position of a magnetic object with a precision determined by the length of said array of magnetic nanosensor.

3. The method of claim 1 wherein said plurality of magneto-resistive nanowires comprises a giant magneto-resistive (GMR) nanowire.

4. The method of claim 1 wherein said plurality of magneto-resistive nanowires comprises an anisotropic magneto-resistive (AMR) nanowire.

5. The method of claim 1 wherein said array of magnetic nanosensor covers 360-degree angle at equal intervals.

6. The method of claim 1 further comprising printing or mounting a plurality of supporting electronics on said flexible substrate for sensing and control information.

7. The Method of claim 1, wherein the circular substrate includes a diameter of about one millimeter.

8. The method of claim 1, wherein said array of magnetic nanosensor comprises at least ten nanowires which lower variability of said array of magnetic nanosensor.

9. A nanowire magnetic compass, comprising:
    a plurality of magneto-resistive nanowires printed on a flexible circular substrate to create an array of magnetic nanosensors, wherein said array of magnetic nanosensors is interconnected by metalization thereby enabling position sensing of a magnetic object, wherein said array of magnetic nanosensor is adapted with said circular substrate to detect an azimuth direction of magnetic field with high resolution thereto.

10. The nanowire magnetic compass of claim 9, wherein said circular substrate is a flexible substrate adapted to be bent into a circular configuration.

11. The nanowire magnetic compass of claim 10, wherein the circular substrate includes a diameter of about one millimeter.

12. The nanowire magnetic compass of claim 9, wherein said array of magnetic nanosensor comprises at least ten nanowires which lower variability of said array of magnetic nanosensor.

13. The nanowire magnetic compass of claim 9 wherein said plurality of magneto-resistive nanowires comprises of giant magneto-resistive (GMR) material.

14. The nanowire magnetic compass of claim 9 wherein said plurality of magneto-resistive nanowires comprises of a anisotropic magneto-resistive (AMR) material.

15. The nanowire magnetic compass of claim 9 wherein said plurality of magneto-resistive nanowires comprises of a colossal magneto-resistive (CMR) material.

16. The nanowire magnetic compass of claim 9 wherein said array of magnetic nanosensor covers 360-degree angle at equal intervals.

17. The nanowire magnetic compass of claim 9 further comprising a plurality of supporting electronics printed on said flexible substrate and adapted for providing sensing and control information.

18. The nanowire magnetic compass of claim 9, wherein precision of said nanowire magnetic compass is determined by the length of said array of magnetic nanosensors.

19. A magnetic sensor, comprising
a plurality of magneto-resistive nanowires printed on a flexible substrate to create an array of magnetic nanosensors, wherein said array of magnetic nanosensors are connected by metallization, wherein effectiveness of magnetic object position sensing is determined by the length of said array of magnetic nanosensors.

20. The magnetic sensor of claim 19, wherein said flexible substrated is adapted to be bent into a circular configuration with diameter on order of a millimeter, wherein said array of magnetic nanosensors is adapted with the circular configuration of the substrate to detect an azimuth direction of magnetic field with high resolution thereto.

21. The nanowire magnetic sensor of claim 19, wherein said array of magnetic nanosensor comprises at least ten nanowires which lower variability of said array of magnetic nanosensor.

22. The nanowire magnetic sensor of claim 19 wherein said plurality of magneto-resistive nanowires comprises a giant magneto-resistive (GMR) material.

23. The nanowire magnetic sensor of claim 19 wherein said plurality of magneto-resistive nanowires comprises an anisotropic magneto-resistive (AMR) material.

24. The nanowire magnetic compass of claim 19 wherein said plurality of magneto-resistive nanowires comprises an colossal magneto-resistive (CMR) material.

25. The nanowire magnetic sensor of claim 19 wherein said array of magnetic nanosensor covers 360-degree angle at equal intervals.

* * * * *